United States Patent
Pekny et al.

(10) Patent No.: US 9,691,452 B2
(45) Date of Patent: Jun. 27, 2017

(54) APPARATUSES AND METHODS FOR CONCURRENTLY ACCESSING DIFFERENT MEMORY PLANES OF A MEMORY

(71) Applicant: Micron Technology, Inc., Boise, ID (US)

(72) Inventors: Theodore T. Pekny, San Jose, CA (US); Jae-Kwan Park, Cupertino, CA (US); Violante Moschiano, Avezzano (IT); Michele Incarnati, Gioia dei Marsi (IT); Luca de Santis, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 14/461,152

(22) Filed: Aug. 15, 2014

(65) Prior Publication Data

US 2016/0048343 A1  Feb. 18, 2016

(51) Int. Cl.
*G06F 3/06* (2006.01)
*G06F 12/00* (2006.01)
(Continued)

(52) U.S. Cl.
CPC ............... *G11C 7/22* (2013.01); *G11C 16/26* (2013.01); *G11C 16/32* (2013.01); *G11C 2207/2209* (2013.01)

(58) Field of Classification Search
CPC ..... G06F 3/0611; G06F 3/0659; G06F 3/0688
See application file for complete search history.

(56) References Cited

U.S. PATENT DOCUMENTS

| 6,038,187 A | 3/2000 | Hajji |
| 6,735,116 B2 | 5/2004 | Lee et al. |

(Continued)

FOREIGN PATENT DOCUMENTS

EP  2750018 A2  7/2014

OTHER PUBLICATIONS

International Search and Written Opinion received for PCT/US2015/042660 dated Nov. 6, 2015.

(Continued)

*Primary Examiner* — Yong Choe
(74) *Attorney, Agent, or Firm* — Dorsey & Whitney LLP (57) ABSTRACT

Apparatuses and methods for performing concurrent memory access operations for different memory planes are disclosed herein. An example apparatus may include a memory array having a plurality of memory planes. Each of the plurality of memory planes comprises a plurality of memory cells. The apparatus may further include a controller configured to receive a group of memory command and address pairs. Each memory command and address pair of the group of memory command and address pairs may be associated with a respective memory plane of the plurality of memory planes. The internal controller may be configured to concurrently perform memory access operations associated with each memory command and address pair of the group of memory command and address pairs regardless of page types associated with the pairs of the group (e.g., even if two or more of the memory command and address pairs may be associated with different page types).

34 Claims, 5 Drawing Sheets

(51) Int. Cl.
  *G11C 7/22*   (2006.01)
  *G11C 16/26*  (2006.01)
  *G11C 16/32*  (2006.01)

(56) References Cited

U.S. PATENT DOCUMENTS

| | | |
|---|---|---|
| 7,280,398 B1 | 10/2007 | Lee |
| 8,117,436 B2 | 2/2012 | Zhang et al. |
| 8,289,802 B2 | 10/2012 | Lee |
| 8,379,450 B2 | 2/2013 | Kim |
| 8,473,669 B2 | 6/2013 | Sinclair |
| 8,533,405 B2 | 9/2013 | Kim et al. |
| 8,619,493 B2 | 12/2013 | Kim |
| 8,966,201 B2 | 2/2015 | Sela et al. |
| 2005/0268024 A1* | 12/2005 | Seo ............... G06F 13/1631 711/5 |
| 2011/0191651 A1 | 8/2011 | Chen et al. |
| 2011/0208896 A1 | 8/2011 | Wakrat et al. |
| 2012/0014168 A1 | 1/2012 | Li et al. |
| 2012/0113721 A1 | 5/2012 | Kim |
| 2013/0279251 A1 | 10/2013 | Lee et al. |
| 2014/0068159 A1* | 3/2014 | Yi ............... G06F 12/0246 711/103 |
| 2014/0173174 A1 | 6/2014 | Frickey et al. |
| 2015/0003156 A1 | 1/2015 | Berckmann et al. |
| 2015/0063024 A1 | 3/2015 | Yip et al. |

OTHER PUBLICATIONS

Notice of Allowance and Search Report, ROC (Taiwan) Patent Application No. 104125867, Mar. 29, 2016, pp. 1-4 (English translation of Search Report provided).

\* cited by examiner

APPARATUSES AND METHODS FOR CONCURRENTLY ACCESSING DIFFERENT MEMORY PLANES OF A MEMORY

BACKGROUND

Memories may be provided in a variety of apparatuses, such as computers or other devices, including but not limited to portable memory devices, solid state drives, music players, cameras, phones, wireless devices, displays, chip sets, set top boxes, gaming systems, vehicles, and appliances. There are many different types of memory including volatile memory (e.g., dynamic random access memory (DRAM)) and non-volatile memory (e.g., flash memory). Flash memory architectures may include NAND or NOR architecture.

In non-volatile memories (e.g., NAND flash memories), memory arrays may be divided into planes. Dividing a memory into memory planes may break up rows or columns into smaller sections for accessing during memory access operations. Breaking the memory up into memory planes may also present an opportunity to access more than one portion of the memory array concurrently. Typically, concurrent access may require access of memory cells that are coupled to the same respective access line driver, which may limit an ability to concurrently access different memory planes during random memory access requests.

DETAILED DESCRIPTION

Apparatuses and methods for concurrent access of different memory planes are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
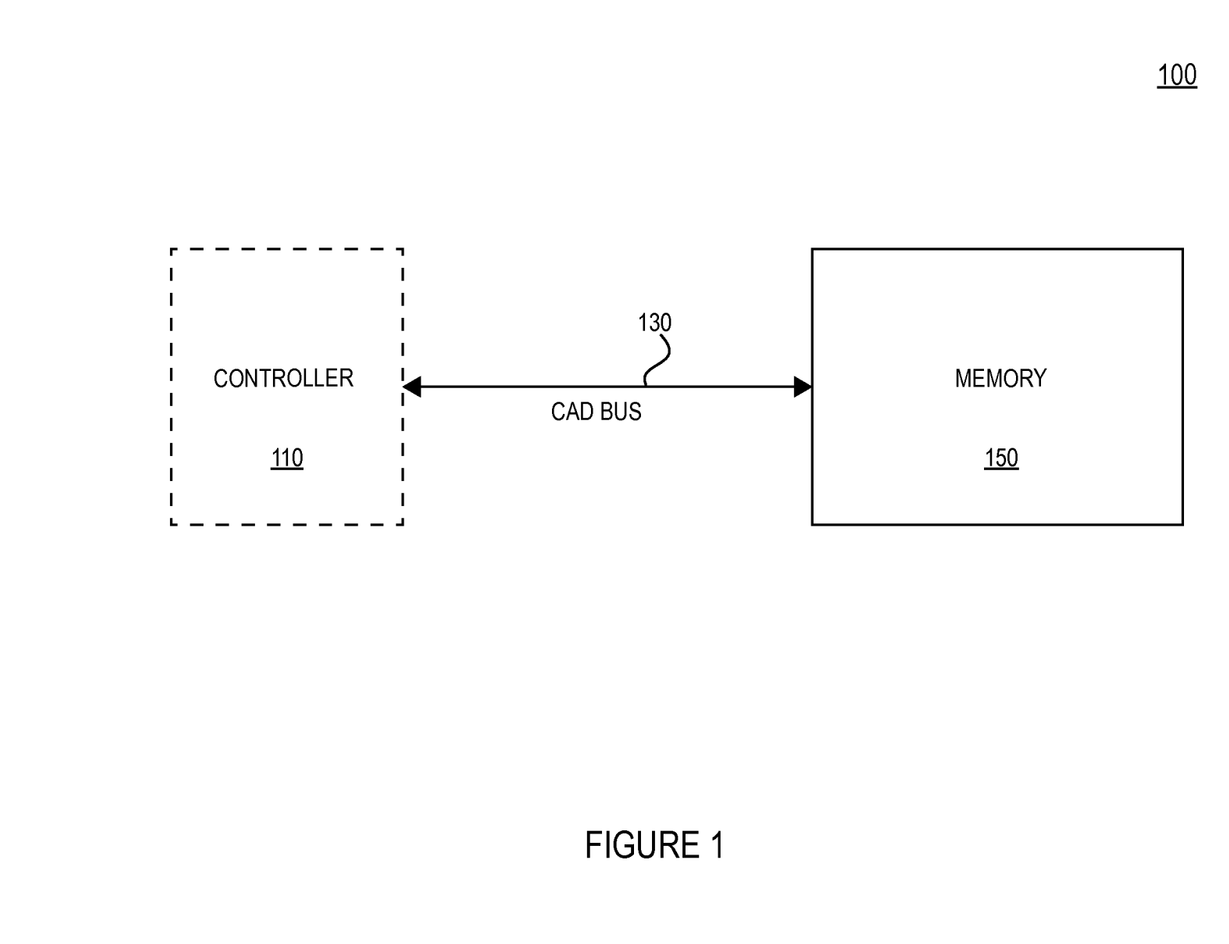
FIG. 1 is a block diagram of an apparatus including a memory configured to perform concurrent memory access of different memory planes according to an embodiment of the present disclosure.

FIG. 1 is a block diagram of an apparatus 100 (e.g., an integrated circuit, a memory device, a memory system, an electronic device or system, a smart phone, a tablet, a computer, a server, etc.) including a memory configured to perform concurrent memory access of different memory planes according to an embodiment of the present disclosure. The apparatus 100 may include a memory 150. In some embodiments, the memory 150 may be coupled to a controller 110 via a command, address, and data (CAD) bus 130. The memory 150 may be configured to receive commands and/or addresses from the controller 110 over the CAD bus 130, and the memory may be configured to receive data and/or provide data over the CAD bus 130.

In some examples, the memory 150 may be a non-volatile memory, such as NAND, NOR, or PCM flash memory. The memory 150 may include an array of cells organized in multiple planes (e.g., partitions). The memory planes may be divided into blocks of memory cell pages. Each page may include a row or column of memory cells that are coupled to a respective access line. The memory 150 may provide voltage on an access line during a memory access operation to erase, program, and/or read from a page of memory cells. The access line voltages required to access data of a page of memory cells may depend on a page type. A page type may be based on a type of memory cell in the page (e.g., single level cell SLC, multi-level cell MLC, triple level cell TLC, etc.) and a level of the memory cells being accessed (e.g., upper page UP, lower page LP, middle page MP, for a SLC/MLC/TLC page). The memory 150 may include circuitry that performs concurrent memory page accesses of two or more memory planes. For example, the memory 150 may include a respective access line driver circuit and power circuit for each memory plane of the memory 150 to facilitate concurrent access of pages of two or more memory planes, including different page types. In some embodiments, the memory page accesses are concurrent, for example, memory access operations for the respective memory pages at least partially temporally overlap. In some embodiments, memory access operations for the respective memory pages may occur simultaneously, however, embodiments of the invention are not limited to simultaneous memory access operations.

In some examples, the memory 150 may include an internal controller configured to execute a universal algorithm to concurrently access different memory planes. The universal algorithm may serially configure power circuits and access line driver circuits for two or more memory planes based on respective page type (e.g., UP, MP, LP, SLC/MLC/TLC page) for concurrent memory access operations. The universal algorithm may concurrently access the respective pages of each of the two or more memory planes during the concurrent memory access operations, for example, by controlling, retrieving data from, and/or providing data to page buffers associated with each of the two or more memory planes. In another example, the memory 150 may include a multithread controller configured to concurrently perform memory access operations for two or more memory planes of the memory 150. That is, the multithread controller may concurrently control the access line driver circuits and power circuits for the concurrent memory access operations, in addition to concurrently accessing the respective pages of each of the two or more memory planes during the concurrent memory access operations (e.g., by controlling, accessing data from, and/or providing data to the respective page buffers).

During operation, the memory 150 may receive a group of memory command and address pairs. The received group of memory command and address pairs may be provided by the controller 110. The memory 150 may be configured to perform concurrent memory operations (e.g., read operations or program operations) for different memory planes associated with the group of memory command and address pairs. For example, when the group of memory command and address pairs are read commands, the memory 150 may concurrently retrieve respective read data from different memory planes of the memory 150. Further, when the group of memory command and address pairs are program commands associated with a common page type, the memory 150 may concurrently program data associated with each memory command and address pair to different memory planes of the memory 150. The memory 150 may provide the read data to the controller 110 and receive the data from the controller 110 via the CAD bus 130. The memory 150 may provide additional information to the controller 110 over the CAD bus 130 in response to particular commands. The information may indicate, for instance, whether the memory 150 is available to perform a memory operation and/or an amount of time before the memory 150 may become available to perform a memory operation.

Typically, during a memory access operation, a procedure for accessing data of a page may be dependent on a page type. That is, to read data from an MLC or TLC page, read voltages may depend on which level (e.g., bit) of each memory cell of the page is being read. For example, if a bit in the UP of an MLC page is being read, a first read voltage may be provided (e.g., applied) to the associated access line during the read operation. If a bit in the LP of an MLC page is being read, a second and/or a third read voltage may be provided to the associated access line during the read operation.

In some examples, the memory 150 may include an internal controller configured to execute a universal algorithm to concurrently access different memory planes, regardless of page type. The internal controller may execute the universal algorithm to serially configure, for concurrent memory access operations, power circuits and access line driver circuits for two or more memory planes based on respective page type (e.g., UP, MP, LP, SLC/MLC/TLC page). In some embodiments, each memory plane is associated with a respective power circuit and a respective access line driver circuit, and the internal controller configures the respective power circuits and access line driver circuits according to the particular memory access for the associated memory planes. For example, the internal controller may configure a first access line driver circuit and a first power circuit, associated with a first memory plane, for a UP read. The internal controller may then configure a second access line driver circuit and a second power circuit, associated with a second memory plane, for a LP read. After the access line driver circuits and power circuits have been configured, the internal controller executing the universal algorithm may concurrently access the respective pages of each of the two or more memory planes, for example, retrieving data or programming data, during the concurrent memory access operations. The concurrent memory access operations may include, for example, charging bitlines, and sensing and latching data at respective page buffers.

In another example, the memory 150 may include a multithread controller configured to concurrently perform memory access operations for two or more memory planes of the memory 150. That is, the multithread controller may concurrently configure power circuits and access line driver circuits for two or more memory planes based on respective page type (e.g., UP, MP, LP, SLC/MLC/TLC page) for the concurrent memory access operations, in addition to concurrently accessing the respective pages of each of the two or more memory planes during the concurrent memory access operations.

Due to the serial aspect of the universal algorithm, examples including an internal controller configured to execute the universal algorithm may have a higher latency than examples including the multithread controller. The multithread controller may provide improved time performance, but requires a larger circuit area than an internal controller configured to execute the universal algorithm. The internal controller configured to execute the universal algorithm and the multithread controller may each offer improved efficiency (e.g., when received random address memory access requests) and performance of the memory 150 as compared with a memory with an internal controller that does not support concurrent access of different memory planes or only supports limited concurrent access of different memory planes.

Figure 2:
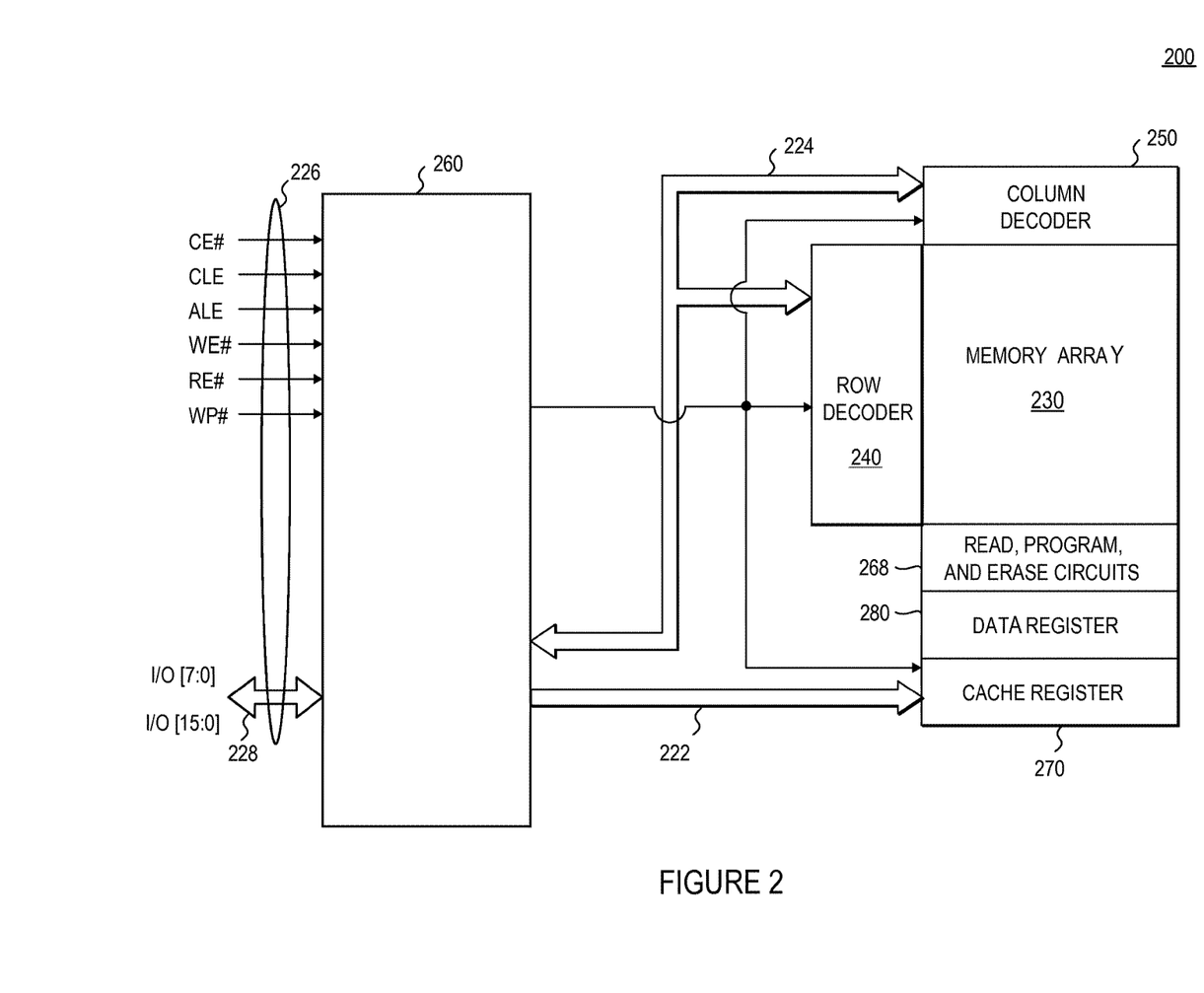
FIG. 2 is a block diagram of memory configured to perform concurrent memory access of different memory planes according to an embodiment of the present disclosure.

FIG. 2 illustrates a memory 200 configured to perform concurrent memory access of different memory planes according to an embodiment of the present disclosure. The memory 200 includes a memory array 230 with a plurality of memory cells. The memory cells may be non-volatile memory cells, such as NAND flash cells, or may generally be any type of memory cells. The memory 200 may include the memory 150 of FIG. 1. In some examples, the memory array 230 may be divided into a plurality of memory planes.

Command signals, address signals and data signals may be provided to the memory 200 as sets of sequential input/output ("I/O") signals transmitted through a command, address, and data (CAD) bus 226. Similarly, data signals may be provided from the memory 200 through the CAD bus 226. The CAD bus may include an I/O bus 228 that is connected to an internal controller 260. The I/O bus 228 may provide the command signals, address signals, and data signals to the internal controller 260. The internal controller 260 may route the signals between the I/O bus 228 and an internal data bus 222, and an internal address bus 224. The internal controller 260 may be included in the memory 150 of FIG. 1. The internal controller 260 may receive a number of control signals through the CAD bus 226 to control the operation of the memory 200. The internal controller 260 may facilitate concurrent memory access of different memory planes of the memory array 230. In some examples, the internal controller 260 may be configured to execute a universal algorithm to concurrently access different memory planes, regardless of page type. For example, the internal controller 260 may receive the memory command and address pairs, and may serially provide (e.g., send) signals to the column decoder 250 and/or the row decoder 240 to configure power circuits and access line driver circuits for two or more memory planes of the memory array 230 based on respective page type based on the received memory command and address pairs. The internal controller 260 may concurrently access the respective pages of each of the two or more memory planes of the memory array 230, for example, retrieving data or programming data, during the concurrent memory access operations, for example, by controlling, retrieving data from, and/or providing data to page buffers that are associated with each of the two or more memory planes. The concurrent memory access operations may include, for example, charging bitlines, and sensing and latching data at page buffers.

In another example, the internal controller may include a multithread controller configured to concurrently perform memory access operations for two or more memory planes of the memory array 230. For example, portions of the internal controller 260 may be associated with each thread of the multithread controller. For example, the internal controller 260 may include threads to concurrently and independently control the access line driver circuits and power circuits of the column decoder 250 and/or the row decoder 240 for the concurrent memory access operations. The internal controller 260 may include threads to access the respective pages of each of the two or more memory planes of the memory array 230, for example, retrieving data or programming data, during the concurrent memory access operations, for example, by controlling, retrieving data from, and/or providing data to individual page buffers that are associated with each of the two or more memory planes.

The address bus 224 provides block-row address signals to a row decoder 240 and column address signals to a column decoder 250. The row decoder 240 and column decoder 250 may be used to select blocks of memory or memory cells for memory operations, for example, read, program, and erase operations. The column decoder 250 may enable data signals to be provided to columns of memory corresponding to the column address signals and allow data signals to be provided from columns corresponding to the column address signals. In some examples, the column decoder 250 and/or the row decoder 240 may include a respective access line driver circuit and power circuit for each memory plane of the memory array 230. The access line driver circuits may be coupled to the respective memory planes via a respective plurality of global access lines.

In response to the memory commands decoded by the internal controller 260, the memory cells in the array 230 are read, programmed, or erased. Read, program, erase circuits 268 coupled to the memory array 230 receive control signals from the internal controller 260 and include voltage generators for providing various pumped voltages for read, program and erase operations.

After the row address signals have been provided to the address bus 224, the internal controller 260 provides (e.g., routes) data signals to a cache register 270 for a program operation. The data signals are stored in the cache register 270 in successive sets each having a size corresponding to the width of the I/O bus 228. The cache register 270 sequentially stores the sets of data signals for an entire page (e.g., row) of memory cells in the array 230. All of the stored data signals are then used to program a page of memory cells in the array 230 selected by the block-row address coupled through the address bus 224. In a similar manner, during a read operation, data signals from a page of memory cells selected by the block-row address coupled through the address bus 224 are stored in a data register 280. Sets of data signals corresponding in size to the width of the I/O bus 228 are then sequentially transferred through the internal controller 260 from the register 270 to the I/O bus 228.

Figure 3:
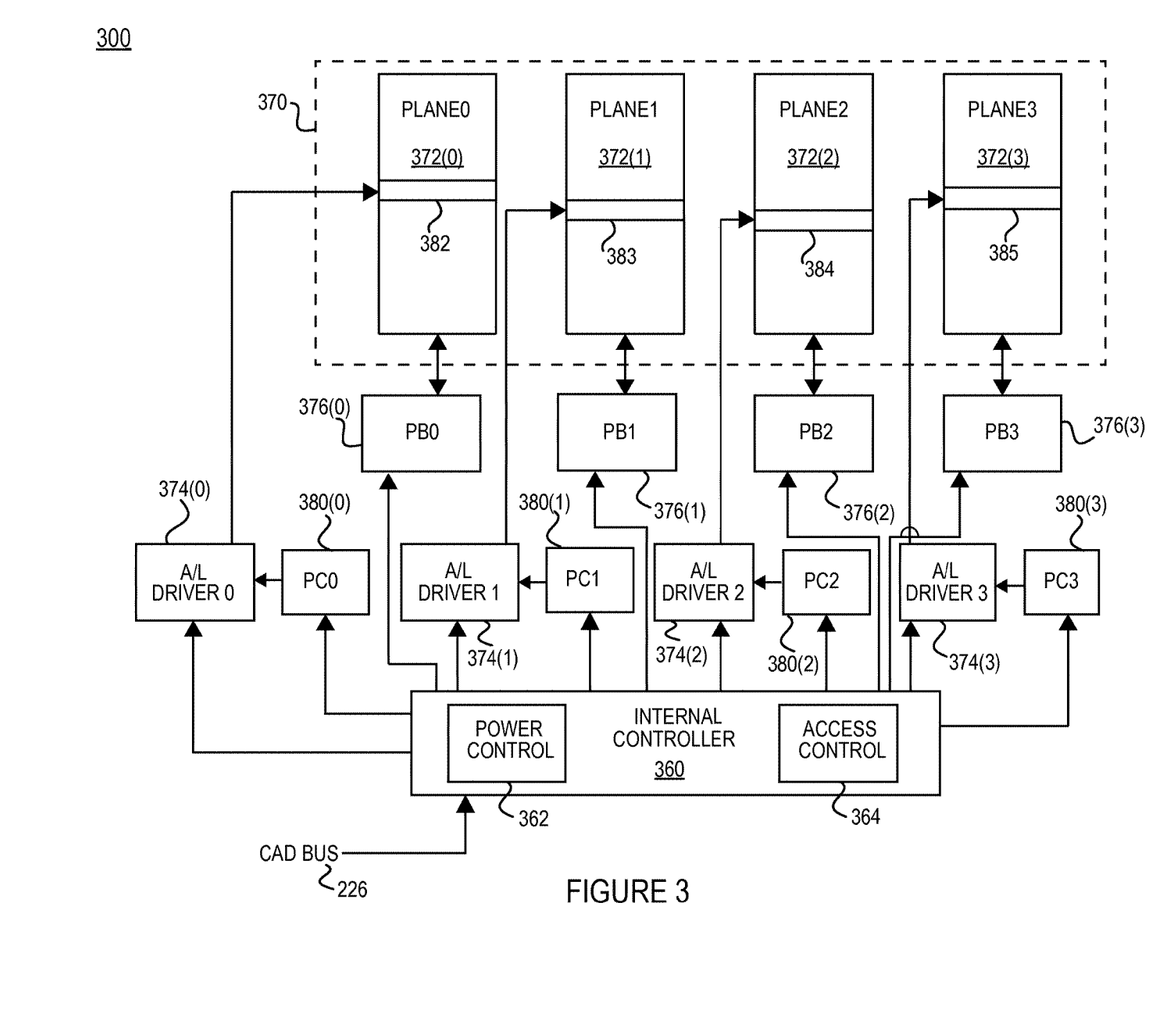
FIG. 3 is a block diagram of memory configured to perform concurrent memory access of different memory planes according to an embodiment of the present disclosure.

FIG. 3 illustrates a memory 300 configured to perform concurrent memory access of different memory planes according to an embodiment of the present disclosure. The memory 300 includes a memory array 370 with a plurality of memory planes 372(0)-372(3) that each includes a respective plurality of memory cells. The memory 300 may further include an internal controller 360 including a power control circuit 362 and access control circuit 364 for concurrently performing memory access operations for different memory planes 372(0)-372(3). The memory 300 may be implemented in the memory 150 of FIG. 1, and/or the memory 200 of FIG. 2. The memory cells may be non-volatile memory cells, such as NAND flash cells, or may generally be any type of memory cells.

The memory planes 372(0)-372(3) may each be divided into blocks of data, with a different relative block of data from each of the memory planes 372(0)-372(3) concurrently accessible during memory access operations. For example, during memory access operations, data block 382 of the memory plane 372(0), data block 383 of the memory plane 372(1), data block 384 of the memory plane 372(2), and data block 385 of the memory plane 372(3) may each be accessed concurrently.

Each of the memory planes 372(0)-372(3) may be coupled to a respective page buffer 376(0)-376(3). Each page buffer 376(0)-376(3) may be configured to provide data to or receive data from the respective memory plane 372(0)-372(3). The page buffers 376(0)-376(3) may be controlled by the internal controller 360. Data received from the respective memory plane 372(0)-372(3) may be latched at the page buffers 376(0)-376(3), respectively, and retrieved by the internal controller 360, and provided on the CAD bus 226.

Each of the memory planes 372(0)-372(3) may be further coupled to a respective access line (A/L) driver circuit 374(0)-374(3). The A/L driver circuits 374(0)-374(3) may be configured to condition a page of a respective block of an associated memory plane 372(0)-372(3) for a memory access operation, such as programming data, reading data, or erasing data. Each of the A/L driver circuits 374(0)-374(3) may be coupled to a respective plurality of global access lines associated with a respective memory plane 372(0)-372(3). Each plurality of global access lines may be selectively coupled to a respective plurality of local access lines within a block of a plane during a memory access operation associated with a page within the block. The A/L driver circuits 374(0)-374(3) may be controlled based on signals from the internal controller 360. Each of the A/L driver circuits 374(0)-374(3) may be coupled to a respective power circuit 380(0)-380(3), and may provide voltages to respective access lines based on voltages provided by the respective power circuit 380(0)-380(3). The voltages provided by the power circuits 380(0)-380(3) may be based on signals received from the internal controller 360.

The internal controller 360 may control the A/L driver circuits 374(0)-374(3), page buffers 376(0)-376(3), and the power circuits 380(0)-380(3) to concurrently perform memory access operations associated with each of a group of memory command and address pairs (e.g., received from a controller, such as the 110 of FIG. 1). For example, the internal controller 360 may control the A/L driver circuits 374(0)-374(3), the page buffer 376(0)-376(3), and the power circuits 380(0)-380(3) to perform the concurrent memory access operations. The internal controller 360 may be implemented in the internal controller 260 of FIG. 2, for example.

The internal controller 360 may be configured to execute a universal algorithm to control the A/L driver circuits 374(0)-374(3), page buffers 376(0)-376(3), and the power circuits 380(0)-380(3) to perform the concurrent memory access operations. The internal controller 360 may include the power control circuit 362 that serially configures two or more of the A/L driver circuit 374(0)-374(3) and power circuit 380(0)-380(3) pairs for the concurrent memory access operations. The internal controller 360 may further include the access control circuit 364 configured to control two or more of the page buffers 376(0)-376(3) to sense and latch data from the respective memory planes 372(0)-372(3), or program data to the respective memory planes 372(0)-372(3) to perform the concurrent memory access operations.

In operation, the internal controller 360 may receive a group of memory command and address pairs via the CAD bus 226, with each pair arriving in parallel or serially. In some examples, the group of memory command and address pairs may each be associated with different respective memory planes 372(0)-372(3) of the memory array 370. The internal controller 360 may be configured to perform concurrent memory access operations (e.g., read operations or program operations) for the different memory planes 372(0)-372(3) of the memory array 370 responsive to the group of memory command and address pairs.

The internal controller 360 may be configured to execute a universal algorithm to control memory circuits to concurrently access different memory planes, regardless of page type. For example, the power control circuit 362 of the internal controller 360 may serially configure, for the concurrent memory access operations based on respective page type (e.g., UP, MP, LP, SLC/MLC/TLC page), the power circuits 380(0)-380(3) and the access line driver circuits 374(0)-374(3) for two or more memory planes 372(0)-372(3) associated with the group of memory command and address pairs. After the power circuits 380(0)-380(3) and the access line driver circuits 374(0)-374(3) have been configured, the access control circuit 364 of the internal controller 360 may concurrently control the page buffers 376(0)-376(3) to access the respective pages of each of the two or more memory planes 372(0)-372(3) associated with the group of memory command and address pairs, such as retrieving data or writing data, during the concurrent memory access operations. For example, the access control circuit 364 may concurrently (e.g., in parallel and/or contemporaneously) control the page buffers 376(0)-376(3) to charge/discharge bitlines, sense data from the two or more memory planes 372(0)-372(3), and/or latch the data.

Based on the signals received from the internal controller 360, the A/L driver circuits 374(0) 374(3) that are coupled to the memory planes 372(0) 372(3) associated with the group of memory command and address command pairs may select blocks of memory or memory cells from the associated memory plane 372(0) 372(3), for memory operations, such as read, program, and/or erase operations. The A/L driver circuits 374(0) 374(3) may drive different respective global access lines within the plurality of global access lines associated with a respective memory plane 372(0)-372(3). As an example, the A/L driver circuit 374(0) may drive a first voltage on a first global access line of a first plurality of global access lines associated with the memory plane 372(0), the A/L driver circuit 374(1) may drive a second voltage on a third global access line of a second plurality of global access lines associated with the memory plane 372(1), the A/L driver circuit 2 374(2) may drive a third voltage on a seventh global access line of a third plurality of global access lines associated with the memory plane 372(2), etc., and other voltages may be driven on each of the remaining global access lines of the first, second, third, etc., plurality of global access lines. In some examples, pass voltages may be provided on all access lines except an access line associated with a page of a memory plane 372(0) 372(3) to be accessed. The internal controller 360, the A/L driver circuits 374(0) 374(3), and the power circuits 380(0) 380(3) may allow different respective pages, and the page buffers 376(0) 376(3) within different respective blocks of memory cells, to be accessed concurrently. For example, a first page of a first block of a first memory plane may be accessed concurrently with a second page of a second block of a second memory plane, regardless of page type.

The page buffers 376(0)-376(3) may provide data to or receive data from the internal controller 360 during the memory access operations responsive to signals from the internal controller 360 and the respective memory planes 372(0)-372(3). The internal controller 360 may provide the received data to a controller, such as the controller 110 of FIG. 1.

It will be appreciated that the memory 300 may include more or less than four memory planes, A/L driver circuits, power circuits, and page buffers. It will also be appreciated that the respective plurality of global access lines may include 8, 16, 32, 64, 128, etc., global access lines. The internal controller 360, the A/L driver circuits 374(0) 374(3), and the power circuits 380(0) 380(3) may concurrently access different respective pages within different respective blocks of different memory planes when the different respective pages are of a different page type.

Figure 4:
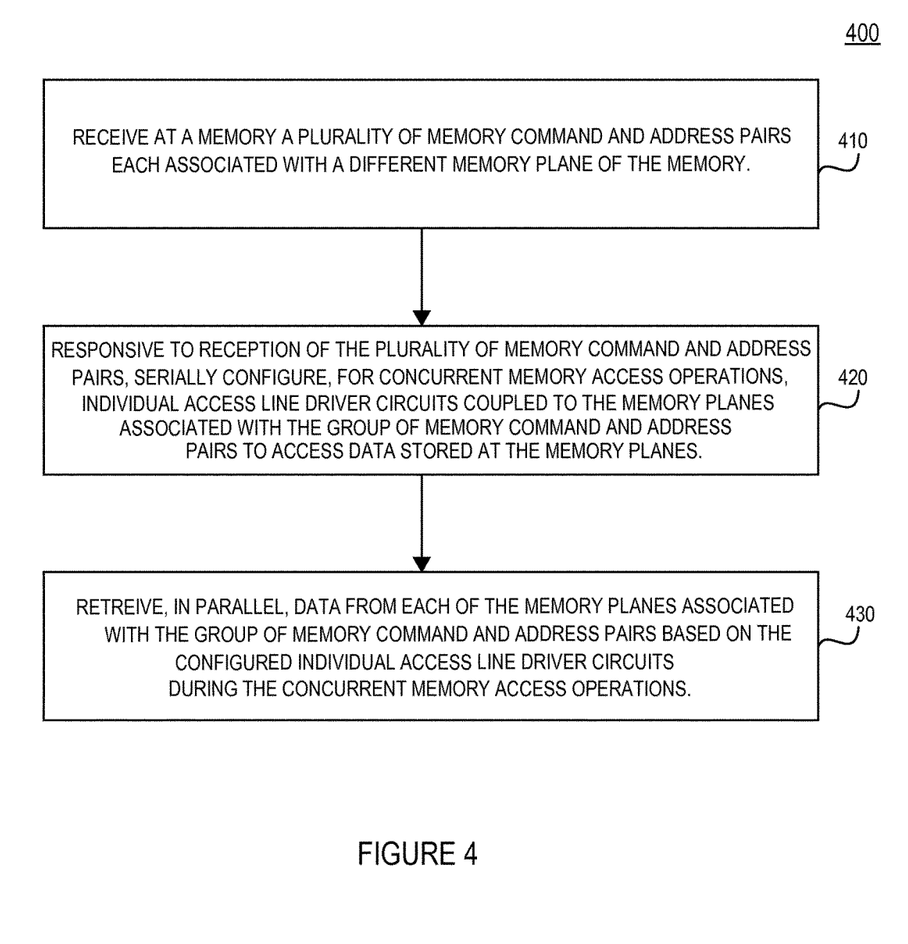
FIG. 4 is an exemplary flowchart of a method of performing concurrent memory access of different memory planes according to an embodiment of the present disclosure.

FIG. 4 is a flowchart 400 for a method for performing concurrent memory access operations for different memory planes according to an embodiment of the disclosure. The method illustrated by the flowchart 400 may be implemented by the memory 150 of FIG. 1, the memory 200 of FIG. 2, and/or the memory 300 of FIG. 3.

The method 400 may include receiving a plurality of memory command and address pairs at a memory, at step 410. Each of the plurality of memory command and address pairs may be associated with a different memory plane (e.g., the memory planes 372(0)-372(3) of FIG. 3) of the memory than other memory command and address pairs of the plurality of memory command and address pairs. The memory command and address pairs may be received at an internal controller, such as the internal controller 260 of FIG. 2, and/or the internal controller 310 of FIG. 3.

The method 400 may further include, responsive to receiving the plurality of memory command and address pairs, serially configuring, for concurrent memory access operations, access line driver circuits (e.g., the access line driver circuits 374(0)-374(3) of FIG. 3) coupled to memory planes associated with the plurality of memory command and address pairs to access data stored at the respective memory plane, at step 420. The method 400 may further include, responsive to receiving the plurality of memory command and address pairs, serially configuring, for the concurrent memory access operations, power circuits (e.g., the power circuits 380(0)-380(3) of FIG. 3) coupled to the access line drivers. Serially configuring the access line driver circuits and/or the power circuits may be performed by the power control circuit 362 of FIG. 3. The method 400 may further include providing respective voltages along respective access lines from each of the access line driver circuits to the respective memory plane.

The method 400 may further include retrieving, in parallel, data from each of the memory planes associated with the group of memory command and address pairs based on the configured access line driver circuits during the concurrent memory access operations, at step 430. Retrieving the data, in parallel, from each of the memory planes associated with the plurality of memory command and address pairs may be performed by the access control circuit 364 of FIG. 3. Retrieving the data, in parallel, from each of the memory planes associated with the plurality of memory command and address pairs may include concurrently charging a respective bitline of each of the memory planes associated with the plurality of memory command and address pairs. Retrieving the data, in parallel, from each of the memory planes associated with the plurality of memory command and address pairs may further include concurrently sensing the data at each of the memory planes associated with the plurality of memory command and address pairs. Retrieving the data, in parallel, from each of the memory planes associated with the group of memory command and address pairs may further include concurrently latching the data at a respective page buffer coupled to each of the memory planes associated with the plurality of memory command and address pairs.

The method 400 may be implemented by a controller, which can be implemented by, for example, a field-programmable gate array (FPGA) device, an application-specific integrated circuit (ASIC), a processing unit such as a central processing unit (CPU), a digital signal processor (DSP), circuitry, another hardware device, a firmware device, or any combination thereof.

Figure 5:
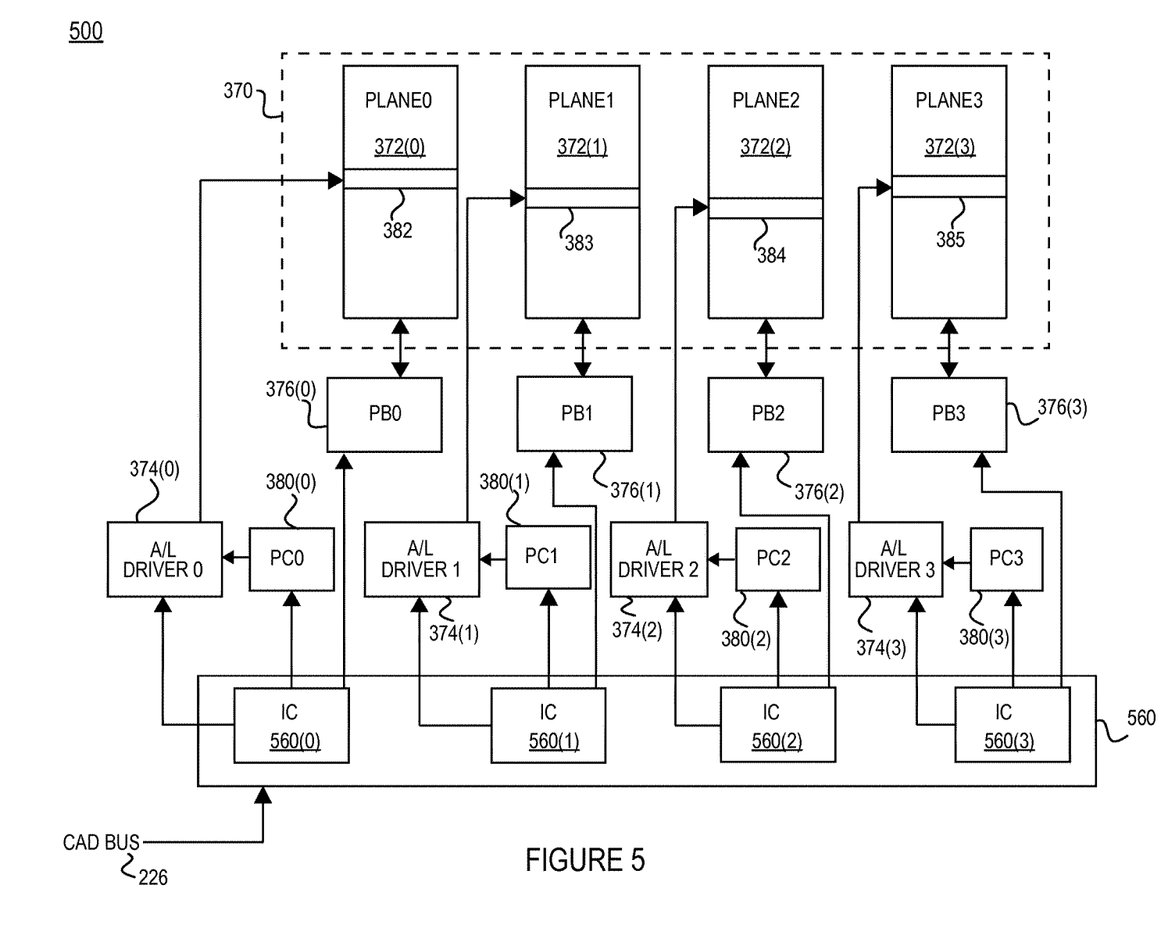
FIG. 5 is a block diagram of memory configured to perform concurrent memory access of different memory planes according to an embodiment of the present disclosure.

FIG. 5 illustrates a memory 500 configured to perform concurrent memory access of different memory planes according to an embodiment of the present disclosure. The memory 500 includes a memory array 370 with a plurality of memory planes 372(0)-372(2) that each includes a respective plurality of memory cells. The memory 500 may further include a multithread internal controller 560 configured to control memory circuits for concurrently performing memory access operations for different memory planes 372(0)-372(3). The memory 500 includes elements that have been previously described with respect to the memory 200 of FIG. 2 and/or the memory 300 of FIG. 3. Those elements have been shown in FIG. 5 using the same reference numbers used in FIGS. 2 and/or 3, and operation of common elements is as previously described. Consequently, a detailed description of the operation of these elements will not be repeated in the interest of brevity. The memory 500 may be implemented in the memory 150 of FIG. 1, and/or the memory 200 of FIG. 2. The memory cells may be non-volatile memory cells, such as NAND flash cells, or may generally be any type of memory cells.

The multithread internal controller 560 may include respective control circuits 560(0)-560(3), each of which is associated with a respective memory plane 372(0)-372(3). The respective control circuits 560(0)-560(3) may operate independently to control respective memory circuits to concurrently perform memory access operations associated with each of a group of memory command and address pairs (e.g., received from a controller, such as the 110 of FIG. 1). Each respective control circuit 560(0)-560(3) may include, for example, individual access control circuits and power control circuits. Each respective control circuit 560(0)-560(3) of the multithread internal controller 560 may control a respective A/L driver circuit 374(0)-374(3), a respective page buffer 376(0)-376(3), and a respective power circuit 380(0)-380(3) to perform the concurrent memory access operations. The multithread internal controller 560 may be implemented in the internal controller 260 of FIG. 2.

In operation, the multithread internal controller 560 may receive a group of memory command and address pairs, with each pair arriving in parallel or serially via the CAD bus 226. In some examples, the group of memory command and address pairs may each be associated with different respective memory plane 372(0)-372(3) of the memory array 370. The multithread internal controller 560 may be configured to control memory circuits to perform concurrent memory operations (e.g., read operations or program operations) for the different memory planes 372(0)-372(3) of the memory array 370 responsive to the group of memory command and address pairs.

As previously described, each respective control circuit 560(0)-560(3) of the multithread internal controller 560 may be associated with a respective memory plane 372(0) 372(3). Each of the respective control circuits 560(0)-560(3) may be provided a respective memory command and address pair of the group of memory command and address pairs received by the multithread internal controller 560. Two or more control threads of the multithread internal controller 560 may independently and concurrently process a respective memory command and address pair of the group of memory command and address pairs directed to a respective memory plane 372(0) 372(3). The respective control circuits 560(0)-560(3) may concurrently and independently configure, for the concurrent memory access operations, the access line driver circuits 374(0) 374(3) and the power circuits 380(0) 380(3). The respective control circuits 560(0)-560(3) may further concurrently independently control and retrieve data from the page buffers 376(0) 376(3) during the memory access operations, using, for example, power control circuits.

Based on the signals received from respective control circuits 560(0)-560(3) of the multithread internal controller 560, the A/L driver circuits 374(0) 374(3) that are coupled to the memory planes 372(0) 372(3) associated with the group of memory command and address command pairs may select blocks of memory or memory cells from the associated memory plane 372(0) 372(3), for memory operations, such as read, program, and/or erase operations. The A/L driver circuits 374(0) 374(3) may drive different respective global access lines within the respective plurality of global access lines. The respective control circuits 560(0)-560(3) of the multithread internal controller 560, the A/L driver circuits 374(0) 374(3), and the power circuits 380(0) 380(3) may allow different respective pages within different respective blocks of memory cells to be accessed concurrently. For example, a first page of a first block of a first memory plane may be accessed concurrently with a second page of a second block of a second memory plane, regardless of page type.

The page buffers 376(0) 376(3) may provide data to or receive data from the respective control circuits 560(0)-560(3) during the memory access operations responsive to signals from the respective control circuit 560(0)-560(3) and the respective memory planes 372(0) 372(3). The multithread internal controller 560 may provide the received data to a controller, such as the controller 110 of FIG. 1.

It will be appreciated that the memory 500 may include more or less than four memory planes, A/L driver circuits, power circuits, and page buffers. It will also be appreciated that the respective plurality of global access lines may include 8, 16, 32, 64, 128, etc., global access lines. The respective control circuit 560(0)-560(3) of the multithread internal controller 560, the A/L, driver circuits 374(0)-374(3), and the power circuits 380(0) 380(3) may concurrently access different respective pages within different respective blocks of different memory planes, which may improve concurrent access during random addressing of the memory 500.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
    a memory array comprising a plurality of memory planes, wherein each of the plurality of memory planes comprises a plurality of memory cells; and a controller configured to receive a group of memory command and address pairs, wherein each memory command and address pair of the group of memory command and address pairs is associated with a respective memory plane of the plurality of memory planes, the controller configured to concurrently perform memory access operations on each memory plane of the plurality of memory planes for a corresponding memory command and address pair of the group of memory command and address pairs regardless of page types associated with the pairs of the group.

2. The apparatus of claim 1, further comprising a plurality of access line driver circuits, wherein an access line driver circuit of the plurality of access line driver circuits is configured to provide voltages to access lines of a plane of the plurality of memory planes during memory access operations based on signals from the controller.

3. The apparatus of claim 2, wherein the controller comprises a power control circuit configured to serially configure, for the memory access operations, access line driver circuits of the plurality of access line driver circuits that are coupled to memory planes of the plurality of memory planes associated with the group of memory command and address pairs, wherein the controller further comprises an access control circuit configured to concurrently retrieve, during the memory access operations, data from the memory planes of the plurality of memory planes associated with the group of memory command and address pairs after serially configuring the access line driver circuits.

4. The apparatus of claim 2, wherein the controller is a multithread controller including a plurality of control threads, each control thread of the plurality of control threads configured to concurrently configure, for the memory access operations, access line driver circuits of the plurality of access line driver circuits that are coupled to memory planes of the plurality of memory planes associated with the group of memory command and address pairs.

5. The apparatus of claim 2, further comprising a plurality of power circuits, wherein a power circuit of the plurality of power circuits is configured to provide two or more voltages to an access line driver circuit of the plurality of access line driver circuits, wherein each of the plurality of power circuits is associated with a respective memory plane of the plurality of memory planes.

6. The apparatus of claim 5, wherein the controller comprises a power control circuit configured to serially configure, for the memory access operations, power circuits of the plurality of power circuits that are associated with the memory planes of the plurality of memory planes associated with the group of memory command and address pairs to provide respective voltages, wherein the controller further comprises an access control circuit configured to concurrently retrieve, during the memory access operations, data from the memory planes of the plurality of memory planes associated with the group of memory command and address pairs after serially configuring the power circuits.

7. The apparatus of claim 1, wherein the plurality of memory cells of a memory plane of the plurality of memory planes includes at least one of multi-level memory cells, triple level memory cells, or single level memory cells.

8. The apparatus of claim 1, wherein each of the group of memory command and address pairs is associated with an upper page type, a lower page type, or a middle page type.

9. The apparatus of claim 1, wherein each of the plurality of memory planes is divided into a respective plurality of blocks, wherein at least two of the group of memory command and address pairs are associated with a different block within a respective plurality of blocks.

10. An apparatus comprising:
a memory array comprising a plurality of memory planes, wherein each of the plurality of memory planes comprises a plurality of memory cells;
a controller configured to receive a group of memory command and address pairs, wherein each memory command and address pair of the group of memory command and address pairs is associated with a respective memory plane of the plurality of memory planes, the controller configured to concurrently perform memory access operations associated with each memory command and address pair of the group of memory command and address pairs regardless of page types associated with the pairs of the group, wherein the controller is a multithread controller including a plurality of control threads, each control thread of the plurality of control threads configured to concurrently configure, for the memory access operations, power circuits of the plurality of power circuits that are coupled to the memory planes of the plurality of memory planes associated with the group of memory command and address pairs to provide respective voltages;
a plurality of access line driver circuits, wherein an access line driver circuit of the plurality of access line driver circuits is configured to provide voltages to access lines of a plane of the plurality of memory planes during memory access operations based on signals from the controller; and
a plurality of power circuits, wherein a power circuit of the plurality of power circuits is configured to provide two or more voltages to an access line driver circuit of the plurality of access line driver circuits, wherein each of the plurality of power circuits is associated with a respective memory plane of the plurality of memory planes.

11. An apparatus, comprising:
a memory array having a plurality of memory planes;
a plurality of access line driver circuits, wherein an access line driver circuit of the plurality of access line driver circuits is configured to provide voltages to access lines of a respective memory plane of the plurality of memory planes; and
a controller coupled to the plurality of access line driver circuits, the controller configured to serially configure the plurality of access line driver circuits for concurrent memory access operations, the controller further configured to concurrently access the plurality of memory planes after serially configuring each of the plurality of access line driver circuits during the concurrent memory access operations.

12. The apparatus of claim 11, further comprising a plurality of power circuits, wherein each of the plurality of power circuits is configured to provide voltages to a respective one of the plurality of access line driver circuits, wherein the controller is further configured to serially configure, for the concurrent memory access operations, the plurality of power circuits coupled to the plurality of access line driver circuits to provide respective voltages.

13. The apparatus of claim 11, wherein the controller is configured to serially configure the plurality of access line driver circuits responsive to a group of memory command and address pairs.

14. The apparatus of claim 13, wherein the group of memory command and address pairs are associated with different page types.

15. The apparatus of claim 11, wherein the controller comprises a power control circuit configured to provide signals to the plurality of access line driver circuits based on an associated page type to control voltages provided to the plurality of memory planes.

16. The apparatus of claim 11, further comprising a plurality of page buffers, wherein each of the plurality of page buffers is configured to latch data from a respective one of the plurality of memory planes, wherein the controller is configured to concurrently retrieve the data from the plurality of page buffers coupled to the plurality of memory planes during the concurrent memory access operations.

17. The apparatus of claim 11, wherein the controller is further configured to concurrently control the sensing of data from the plurality of memory planes.

18. An apparatus, comprising:
a memory array having a first memory plane and a second memory plane, the first memory plane including access lines and the second memory plane including access lines;
a first access line driver circuit configured to provide voltages to access lines of the first memory plane;
a second access line driver circuit configured to provide voltages to access lines of the second memory plane; and
a multithread controller coupled to the first access line driver circuit and the second access line driver circuit, the multithread controller configured to concurrently configure the first access line driver circuit and the second access line driver circuit for concurrent memory access operations, the multithread controller further configured to concurrently access the first memory plane and the second memory plane during the concurrent memory access operations regardless of page types concurrently accessed in the first memory plane and the second memory plane.

19. The apparatus of claim 18, wherein, for the concurrent memory access operations, the multithread controller is configured to configure the first access line driver circuit to provide a first voltage on an access line associated with a page of the first memory plane to be accessed and to provide other voltages that are different than the first voltage on remaining access lines associated with the first memory plane, and the multithread controller is further configured to configure the second access line driver circuit to provide a second voltage on an access line associated with a page of the second memory plane to be accessed and to provide other voltages that are different than the second voltage on remaining access lines associated with the second memory plane.

20. The apparatus of claim 19, further comprising:
a first power circuit configured to provide a first set of voltages to the first access line driver circuit, wherein the first set of voltages includes the first voltage; and
a second power circuit configured to provide a second set of voltages to the second access line driver circuit, wherein the second set of voltages includes the second voltage, wherein the first set of voltages is different than the second set of voltages.

21. The apparatus of claim 20, wherein the multithread controller is further configured to concurrently configure, for the concurrent memory access operations, the first power circuit to provide the first set of voltages and to configure the second power circuit to provide the second set of voltages.

22. The apparatus of claim 18, the memory further comprising:
a first page buffer configured to latch data from the first memory plane responsive to signals from the multithread controller; and
a second page buffer configured to latch data from the second memory plane responsive to signals from the multithread controller.

23. The apparatus of claim 22, wherein the multithread controller is further configured to concurrently retrieve the data from the first page buffer and the second page buffer.

24. A method, comprising:
receiving a plurality of memory command and address pairs at a memory, wherein each of the plurality of memory command and address pairs is associated with a different memory plane of the memory than other memory command and address pairs of the plurality of memory command and address pairs;
responsive to receiving the plurality of memory command and address pairs, serially configuring, for concurrent memory access operations, access line driver circuits coupled to memory planes associated with the group of memory command and address pairs; and
retrieving, in parallel, data from each of the memory planes associated with the group of memory command and address pairs based on the configured access line driver circuits during the concurrent memory access operations.

25. The method of claim 24, further comprising, responsive to receiving the plurality of memory command and address pairs, serially configuring, for the concurrent memory access operations, power circuits coupled to the access line driver circuits.

26. The method of claim 25, further comprising concurrently retrieving data from the two or more memory planes during the concurrent memory access operations.

27. The method of claim 24, further comprising providing respective voltages along respective access lines from each of the access line driver circuits to the respective memory plane.

28. The method of claim 24, wherein retrieving, in parallel, the data from each of the memory planes associated with the group of memory command and address pairs comprises concurrently charging a respective bitline of each of the memory planes associated with the group of memory command and address pairs.

29. The method of claim 28, wherein retrieving, in parallel, data from each of the memory planes associated with the group of memory command and address pairs further comprises concurrently sensing the data at each of the memory planes associated with the group of memory command and address pairs.

30. The method of claim 29, wherein retrieving, in parallel, data from each of the memory planes associated with the group of memory command and address pairs further comprises concurrently latching the data at a respective page buffer coupled to each of the memory planes associated with the group of memory command and address pairs.

31. A method, comprising:
receiving a plurality of memory command and address pairs at a memory, wherein each of the plurality of memory command and address pairs corresponds to a different memory plane of the memory than other memory command and address pairs of the plurality of memory command and address pairs; and responsive to receiving the plurality of memory command and address pairs, concurrently performing memory access operations on each memory plane of the memory for a respective memory command and address pair of plurality of memory command and address pairs.

32. The method of claim 31, further comprising concurrently configuring, for the memory access operations, access line driver circuits coupled to each memory plane of the memory.

33. The method of claim 32, further comprising concurrently configuring, for the concurrent memory access operations, power circuits coupled to the access line driver circuits.

34. The method of claim 31, wherein concurrently performing the memory access operations is controlled by a multithread controller of the memory.

* * * * *